United States Patent
Tanaka et al.

(10) Patent No.: US 9,398,728 B2
(45) Date of Patent: Jul. 19, 2016

(54) STORAGE SUBSYSTEM AND METHOD FOR CONTROLLING THE SAME

(71) Applicant: Hitachi, Ltd., Tokyo (JP)

(72) Inventors: Shigeaki Tanaka, Tokyo (JP); Takashi Chikusa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 97 days.

(21) Appl. No.: 14/376,329

(22) PCT Filed: Dec. 11, 2013

(86) PCT No.: PCT/JP2013/083228
§ 371 (c)(1),
(2) Date: Aug. 1, 2014

(87) PCT Pub. No.: WO2015/087417
PCT Pub. Date: Jun. 18, 2015

(65) Prior Publication Data
US 2015/0342095 A1 Nov. 26, 2015

(51) Int. Cl.
*G11B 33/14* (2006.01)
*H05K 7/20* (2006.01)
*G06F 3/06* (2006.01)
*G06F 12/08* (2016.01)
*G06F 1/20* (2006.01)
*G11B 33/12* (2006.01)

(52) U.S. Cl.
CPC ............ *H05K 7/20736* (2013.01); *G06F 1/20* (2013.01); *G06F 3/06* (2013.01); *G06F 12/08* (2013.01); *G06F 12/0868* (2013.01); *G11B 33/124* (2013.01); *G06F 2212/214* (2013.01)

(58) Field of Classification Search
CPC ............ G11B 33/142; H05K 7/20145; H05K 7/20618
See application file for complete search history.

(56) References Cited

U.S. PATENT DOCUMENTS

| 7,096,317 B2* | 8/2006 | Inoue | G06F 11/1666 711/112 |
| 7,139,170 B2* | 11/2006 | Chikusa | G06F 1/20 165/122 |
| 7,643,289 B2* | 1/2010 | Ye | G06F 1/187 361/679.46 |
| 7,679,898 B2* | 3/2010 | Peng | G06F 1/182 361/679.37 |
| 7,715,188 B2* | 5/2010 | Matsushima | G11B 33/142 165/122 |

(Continued)

FOREIGN PATENT DOCUMENTS

| JP | 07-006513 A1 | 1/1995 |
| JP | 09-297659 A | 11/1997 |

(Continued)

*Primary Examiner* — Robert J Hoffberg
(74) *Attorney, Agent, or Firm* — Volpe and Koenig, P.C.

(57) ABSTRACT

The present invention aims at providing a storage subsystem capable of improving a backend-side I/O processing performance and enabling a single semiconductor memory adapter to be replaced at a time. Therefore, the present invention provides one or more semiconductor memory adapter boards mounting semiconductor memories each having smaller capacity than SSDs attached detachably to a drive canister, a wide port connection established to access the semiconductor memories, the semiconductor memories used as a read cache area of HDDs, and further adopts a wind direction control structure for ensuring a cooling wind path to the HDDs when an adapter board is attached.

15 Claims, 11 Drawing Sheets

(56) References Cited

U.S. PATENT DOCUMENTS

| | | | | |
|---|---|---|---|---|
| 7,778,029 | B2* | 8/2010 | Ueno | G11B 33/142 165/80.3 |
| 8,370,570 | B2* | 2/2013 | Motonaga | G06F 3/0613 711/114 |
| 8,475,246 | B2* | 7/2013 | Mayer | F24F 13/10 454/184 |
| 8,966,174 | B2* | 2/2015 | Motonaga | G06F 3/0613 711/103 |
| 9,084,374 | B2* | 7/2015 | Korikawa | H05K 7/20145 |
| 2005/0132136 | A1 | 6/2005 | Inoue et al. | |
| 2006/0039108 | A1 | 2/2006 | Chikusa et al. | |
| 2009/0122443 | A1* | 5/2009 | Farquhar | G11B 33/142 360/99.13 |

FOREIGN PATENT DOCUMENTS

| | | |
|---|---|---|
| JP | 2004-021811 A | 1/2004 |
| JP | 2005-174178 A | 6/2005 |
| JP | 2006-059448 A | 3/2006 |

* cited by examiner

FIG. 2
(1) FORWARD PERSPECTIVE VIEW
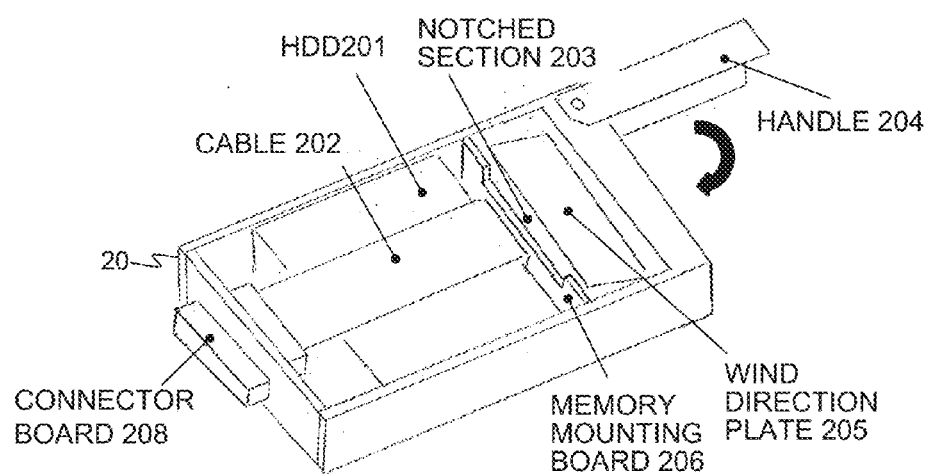
(2) REARWARD PERSPECTIVE VIEW
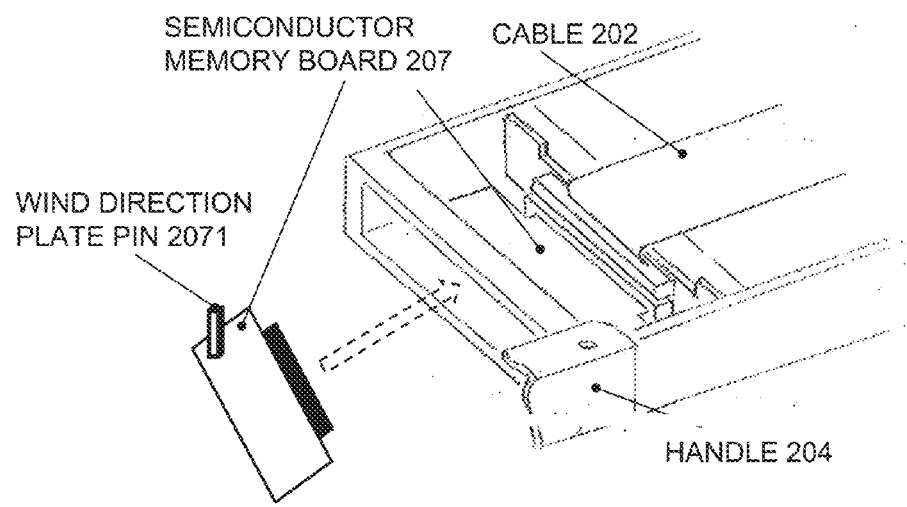

FIG. 3
(1) WHEN SEMICONDUCTOR MEMORY BOARD IS NOT MOUNTED
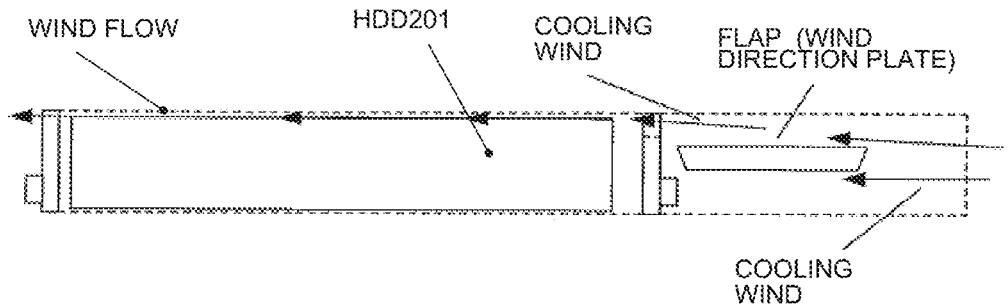
(2) WHEN SEMICONDUCTOR MEMORY BOARD IS MOUNTED
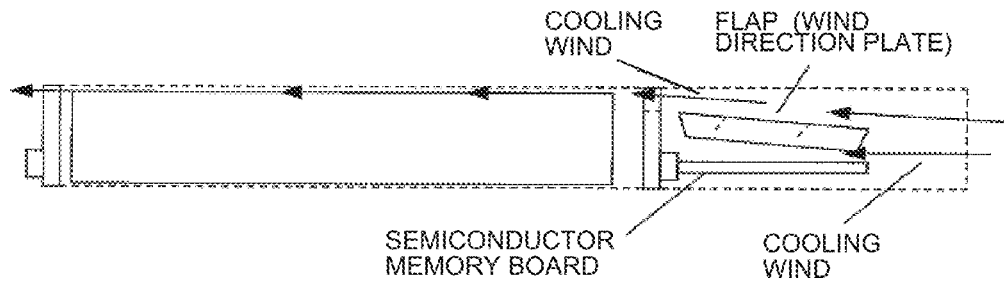
FIG. 4
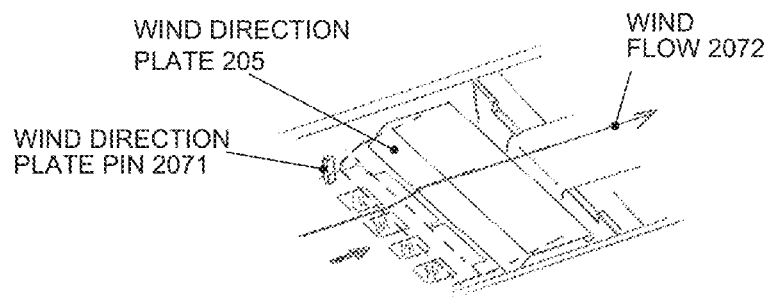

FIG. 8

| LUN ID | LBA | NUMBER OF CACHE SLOTS | VALID FLAG | DRIVE LBA | ENTRY FOR SWAP | TIME STAMP (LAST ACCESS TIME OR PURGE TIME) |
|---|---|---|---|---|---|---|
| 0 | 000000000h | 200h | VALID | 080000000h | N/A | 2013/06/13 10:00:00 |
| 0 | 000001000h | 200h | VALID | 080000000h | N/A | 2013/06/13 10:00:01 |
| : | : | | | | | |
| 1 | 000000000h | 200h | INVALID | 080008000h | P0001 | N/A |
| : | : | | : | : | | |

FIG. 11
(1) EXAMPLE OF MOUNTING TO FRONT SIDE OF CHASSIS
(ONE-TO-ONE MOUNTING OF DRIVE)
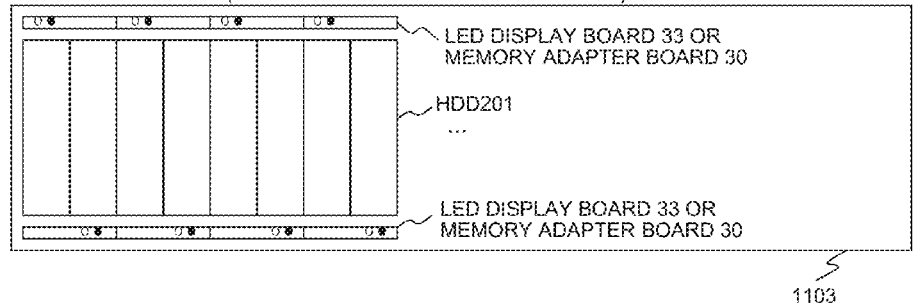
(2) EXAMPLE OF MOUNTING TO INNER SIDE OF CHASSIS
(N-TO-ONE MOUNTING OF DRIVE)
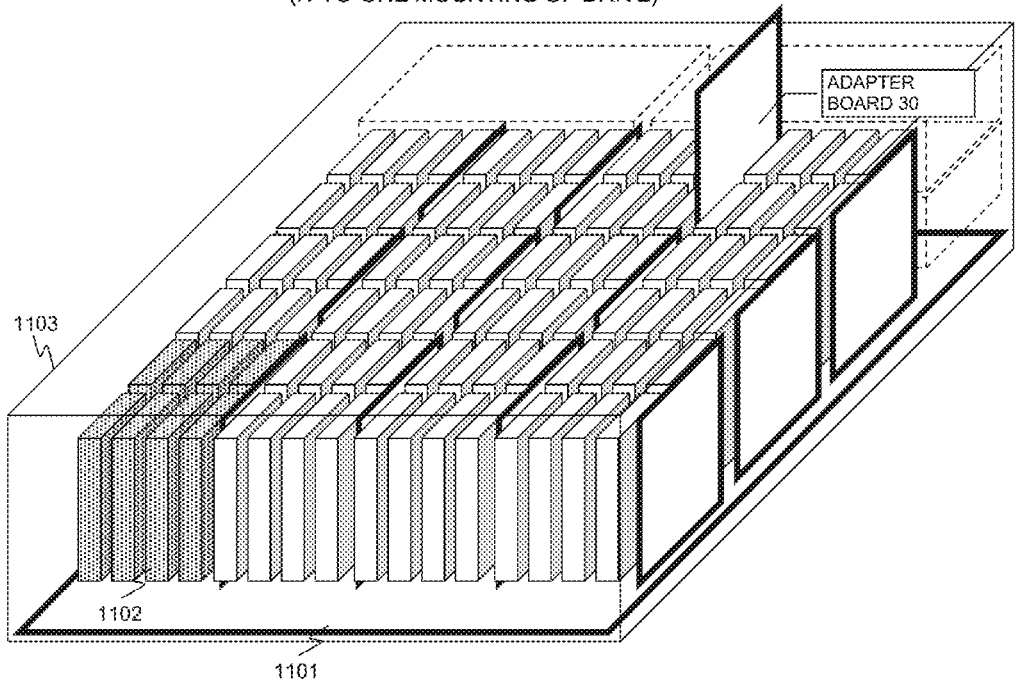

STORAGE SUBSYSTEM AND METHOD FOR CONTROLLING THE SAME

TECHNICAL FIELD

The present invention relates to a storage subsystem and a method for controlling the same.

BACKGROUND ART

Storage systems coupled to multiple host computers have highly-frequently accessed areas called "hot spots" where accesses concentrate to specific data. Recent virtualization techniques enable multiple virtual machines to be operated in the host computers, so that a configuration is possible where a large number of virtual computers several tens of times greater than the number of physical computers actually coupled to the storage system access the storage system.

According to the storage subsystem coupled to such computer system, it is assumed that multiple hot spots occur simultaneously in a scattered manner in virtual disks accessed by virtual machines, and the number of hot spots is considered to increase in proportion to the number of coupled virtual machines. In order to cope with such hot spots from the storage subsystem side, it may be possible to adopt a semiconductor storage device (SSD: Solid State Drive) capable of responding at a higher speed than the prior art HDD (Hard Disk Drive) as a single storage media used in the storage system.

An even higher transmission speed is enabled by mounting a multilink SAS connector (SFF-8630 (corresponding to 2×2 wide port) or SFF-8639 (corresponding to 2×4 wide port)) capable of acting as a wide port device to the SSD. However, since the SSD has a bit cost with respect to the storage capacity that is more expensive than the HDD, a technique for suppressing arrangement costs such as via storage tier control is adopted. Further, in a purpose of use putting more value on performance than on cost, a technique is adopted to use the SSD and the semiconductor memory board as an expansion of the cache memory in the storage subsystem. Patent Literatures 1 and 2 teach techniques related to the above-described art.

CITATION LIST

Patent Literature

[PTL 1] Japanese Patent Application Laid-Open Publication No. H09-297659
[PTL 2] Japanese Patent Application Laid-Open Publication No. 2004-21811

SUMMARY OF INVENTION

Technical Problem

Patent Literature 1 discloses an art related to a storage drive adopting a hybrid configuration composed of flash memories which are nonvolatile semiconductor memories and HDDs. However, since a single flash memory cannot be detached from the storage drive and the flash memory side occupies the first addresses of the LBA, it is not possible to additionally expand a flash memory or to replace only the flash memory having a shorter rewrite life compared to the HDD. Patent Literature 2 teaches a method for coupling a nonvolatile memory to a same path as a disk device (HDD) and using the same to store user data or as a spare for a failure HDD, but the method has the same drawbacks as the art taught in Patent Literature 1. Further, the prior art techniques have the following problems (1) and (2).

(1) Problems from Viewpoint of Performance and Costs

In an example using SSDs adopting flash memories which is the current technical trend, the following problems related to performance and costs occur.

(1-1) Problem of Allocation of Transfer Bandwidth and Restructuring of Data During Failure or End of Life As described, the number of SSDs mounted in a storage subsystem cannot be increased due to the bit-cost difference with respect to HDDs. This causes accesses to be concentrated to the small number of SSDs mounted in the storage subsystem, but since the transfer bandwidth of a single SSD is limited and I/O processing exceeding that bandwidth cannot be performed, access performance is deteriorated thereby. In order to prevent deterioration of access performance, a paradoxical state occurs in that it is necessary to increase the number of expensive SSDs.

Further, the flash memory has a lifetime that is determined by the number of rewrites, and it cannot be used in hot spots where a large number of data update occurs. When failure or end of lifetime occurs to the flash memory, performance is deteriorated, and it becomes necessary to replace drives, accompanying restructuring of data. During data restructure, since the transfer bandwidth is consumed during the replacement processing, the restructuring time is elongated if the SSD has a large capacity, and performance is deteriorated during that time. Such deterioration of performance is fatal especially in SSDs required to provide high performance.

(1-2) Problem Related to Arrangement/Replaceability

As mentioned above, there exist storage drives having flash memories mounted on HDDs as high speed storage media requiring lower cost than SSDs, which uses the flash memory as a cache of the HDD, but it was not possible to separate the flash memory section or to increase the capacity or the number of boards. For example, if such storage drives are mounted to a storage subsystem simply having a RAID function, a narrow link (single port) is used as the interface, similar to HDDs, and it was not possible to achieve similar merits as adopting SSDs due to the transfer bandwidth.

Further, since cache operation is performed in unit levels, the access to each storage drive within the same RAID group causes parity data that is normally deleted after reading on the controller side to be cached, and the efficiency is deteriorated. If the number of disks constituting the RAID group is to be reduced with the aim to minimize the number of mounted SSDs, the storage ratio of redundant data such as parities is increased, and the bit cost per storage capacity is substantially increased. That is, even if parity data is read from the HDD storing the parity data, parity data will still be stored (cached) in the flash memory of the relevant HDD.

(2) Problems Regarding Mounting Surface

On the other hand, in the case of a storage chassis based on an SBB (Storage Bridge Bay) working group standard, which is a standards group of a storage subsystem structure (hereinafter referred to as SBB chassis), there is very little freedom (design freedom) in constituting a special structure to be added to the chassis. Therefore, it is preferable to mount the semiconductor memory to a drive canister having a relatively high design freedom, but since the backboard connector side of the drive canister does not have design freedom, similar to chassis, it is necessary to provide a special additional structure to the outer side of the storage drive.

However, since the electronic components such as flash memories, HDDs and the controller for controlling the same are heat generating bodies, it is necessary to ensure cooling wind flow paths for cooling the flash memories and HDDs, regardless of whether the above-described additional structure is provided or not. Therefore, it is necessary to device a flow path structure capable of ensuring a sufficient flow quantity for cooling the flash memory packages and HDDs, while ensuring the design freedom of the additional structure and preventing the cooling wind from being blocked by the additional structure.

Solution to Problem

In order to solve the above problems, the present invention attaches one or more semiconductor memory adapter boards mounting semiconductor memories having smaller capacities compared to SSDs to a drive canister in a detachable manner, adopts a wide port access interface to the semiconductor memories, and utilizes the semiconductor memories as read cache areas of HDDs. The drive canister is equipped with a wind direction control structure for ensuring a drive (HDD) cooling flow path when an adapter board is mounted.

According to another embodiment, one or more semiconductor memory adapter boards are attached to a baseboard within the chassis of the storage subsystem in a detachable manner.

Advantageous Effects of Invention

According to the storage subsystem of the present invention, the 110 processing performance on the backend side can be improved and the semiconductor memory adaptor can be replaced one at a time, so that costs can be suppressed and the transfer bandwidth can be enhanced, and response to failure when the lifetime of a semiconductor memory ends can be facilitated. Further, efficient cooling can be realized by adopting the wind direction control structure of the present invention. The problems, configuration and effects other than those described above will become apparent according to the following description of preferred embodiments.

BRIEF DESCRIPTION OF DRAWINGS

FIG. 2 is an external view of a drive canister mounting a semiconductor memory adapter board.
FIG. 3 is a view illustrating the structure of a wind direction control mechanism and cooling wind direction control.
FIG. 4 is a view illustrating the operation of the wind direction control mechanism.
FIG. 8 is a view illustrating a configuration example of an external cache table.
FIG. 11 is a view illustrating an example of mounting the semiconductor memory adapter board to a slot on the chassis.

DESCRIPTION OF EMBODIMENTS

Figure 1:
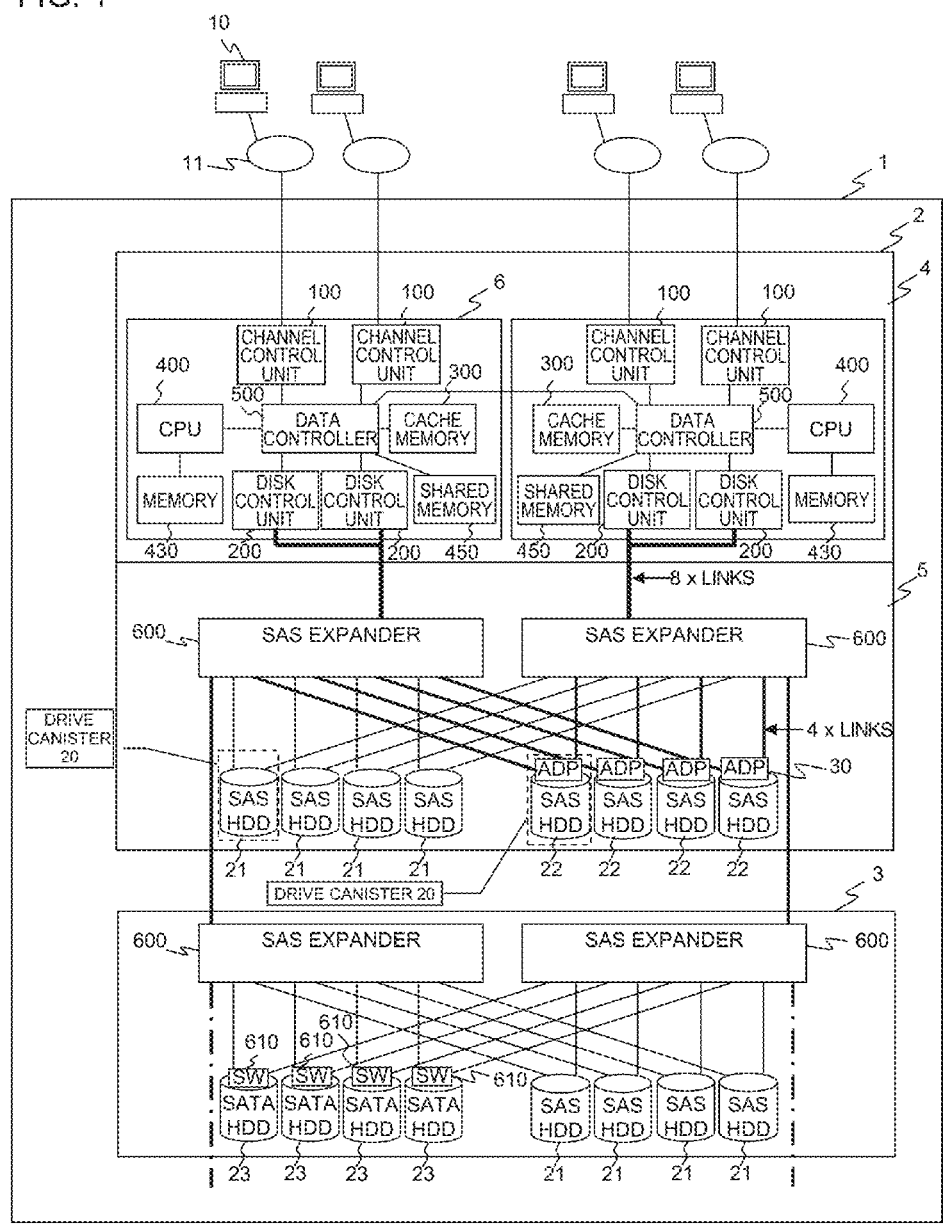
FIG. 1 is a hardware block diagram of a storage subsystem.

Now, the preferred embodiments of the present invention will be described with reference to the drawings. In the following description, various information are referred to as "management tables", for example, but the various information can also be expressed by data structures other than tables. Further, the "management table" can also be referred to as "management information" to indicate that the information does not depend on the data structure.

The processes are sometimes described using the term "program" as the subject. The program is executed by a processor such as an MPU (Micro Processor Unit) or a CPU (Central Processing Unit) for performing determined processes. A processor can also be the subject of the processes since the processes are performed using appropriate storage resources (such as memories) and communication interface devices (such as communication ports). The processor can also use dedicated hardware in addition to the CPU. The computer programs can be installed to each computer from a program source. The program source can be provided via a program assignment server or a storage media, for example.

Each element, such as each controller, can be identified via numbers, but other types of identification information such as names can be used as long as they are identifiable information. The equivalent elements are denoted with the same reference numbers in the drawings and the description of the present invention, but the present invention is not restricted to the present embodiments, and other modified examples in conformity with the idea of the present invention are included in the technical scope of the present invention. The number of each component can be one or more than one, unless defined otherwise.

Embodiment 1

System Configuration and Outline of Invention

FIG. 1 is a block diagram illustrating the hardware of a storage subsystem. FIG. 1 illustrates an example where a semiconductor memory adapter board 30 is attached to a drive canister 20 mounting an HDD such as a SAS drive 22, which is a characteristic feature of the present invention. The drive canister 20 is a small-size chassis having an HDD, an SSD or a semiconductor memory built therein and coupled to a storage subsystem. Further, the semiconductor memory adapter board 30 is an adapter board capable of being coupled to the HDD and which is equipped with a semiconductor memory board having multiple semiconductor memories (re-writable nonvolatile memories such as flash memories according to the present embodiment) mounted on a printed board, and a hardware resource such as a controller (CPU, for example) for controlling the semiconductor memory board.

The storage subsystem 1 is coupled to a host computer 10 via a network 11. The storage subsystem 1 comprises a basic chassis 2 and an expanded chassis 3. The basic chassis 2 has a controller unit 4 and a drive unit 5, and the expanded chassis 3 has a drive unit 5 provided thereto. The controller unit 4 has a storage controller unit 6 (hereinafter referred to as storage controller 6), and the drive unit 5 has multiple SAS expanders 600 and multiple drive canisters 20 provided thereto.

The storage controller unit 6 includes a channel control unit 100, a disk control unit 200, a cache memory 300, a CPU 400, a memory 430, a shared memory 450 and a data controller 500. These components are mounted either directly on a printed board or via connectors or sockets.

The channel control unit 100 is a controller for transmitting and receiving user data and setup information to and from the host computer 10. The CPU 400 is a processor for controlling the whole storage subsystem 1. The memory 430 is for storing various programs and various tables executed by the CPU 400. The data controller 500 is a controller for transferring data and commands among the CPU 400, the respective control units and respective memories. The mounting of the CPU 400 to the printed board is performed either by direct soldering or via a PGA (Pin Grid Array) connector (or a socket). The cache memory 300 and the shared memory 450 are also mounted to the printed board either directly or via a connector.

The cache memory 300 is a memory for temporarily storing the user data from the HDD which is a storage drive of the host computer 10 or the drive unit 5, and control information of the storage subsystem 1. The disk control unit 200 is a controller for transmitting and receiving data with the HDD of the drive unit 5. The shared memory 450 is a memory for storing control information used in a shared manner among respective processors and controllers.

The SAS expander 600 has multiple SAS ports, which is a controller for coupling multiple storage drives (HDD/SSD). Further, the types of the HDDs include, as illustrated, SAS type HDDs 21/22 and SATA type HDDs 23, and for example, the HDDs can be removably built into the drive canisters 20 for each single storage drive.

The disk control unit 200 of the storage controller unit 6 and the SAS expander 600 are coupled via an eight-wide-link (eight lines), and high speed data transmission of 12 Gbps per single line as according to SAS-3 standards is enabled. Further, the SAS expander 600 and the drive canister 20 are also coupled via a four-wide-link (four lines), and high speed data transmission of 12 Gbps per single line is enabled, similar to the connection between the disk control unit 200 and the SAS expander 600.

<External View of Drive Canister>

FIG. 2 is an external view of the drive canister 20 mounting the semiconductor memory adapter board 30. The drive canister 20 comprises an HDD 201, a memory mounting board 206 coupling a semiconductor memory board 207, a cable 202 coupling the memory mounting board 206 and a connector board 208, the connector board 208 coupling to a backboard (not shown)-side connector of the SAS expander 600, a handle 204 for attaching/detaching the drive canister 20 itself to/from the drive unit 5, and a wind direction plate 205.

Further, a notched section 203 is provided to the memory mounting board 206 to enable cooling wind created via an air intake fan (not shown) disposed on the backboard side to be flown efficiently. Further, the drive canister 20 is inserted to the chassis of the storage subsystem 1 from the side of the connector board 208 and mounted thereto by being engaged to an interface connector disposed on the backboard side within the chassis, by which the drive canister can be controlled from the storage controller unit 6.

The drive canister 20 is composed of a connector board 208, an HDD 201, a memory mounting board 206 and a wind direction plate 205, and designed to enable the semiconductor memory board 207 to be mounted thereto. When the semiconductor memory board 207 (semiconductor memory adapter board 30) is mounted with the handle 204 opened, an wind direction plate is moved to conduct the intake air toward the HDD surface. Further, the memory mounting board 206 and the connector board 208 are coupled via a cable 202. According to this structure, the semiconductor memories can be increased or decreased while having the drive canister 20 mounted to the device, and the expansion of capacity is enabled. In the drawing, the handle 204 is opened, but it is possible to have an opening formed on the handle 204 for inserting and removing the semiconductor memory board 207, or to design the handle so that insertion and removal of the semiconductor memory board 207 can be performed. In that case, the semiconductor memory board 207 can be inserted or removed with the handle 204 closed.

<<Wind Direction Control Mechanism>>
<Configuration and Function>

FIG. 3 is a view illustrating a configuration of a wind direction control mechanism and the cooling wind direction control. According to the configuration of the wind direction control mechanism and the cooling wind direction control of FIG. 3, the angle of a wind direction plate (flap) 205 is changed according to the attaching/detaching of the semiconductor memory adapter board 30, so that the cooling wind is effectively introduced into the drive canister 20.

If there is no wind direction plate (flap) 205, the air intake according to the present structure is performed at the circumference of the memory mounting board 206 having a large intake air resistance, so that an intake air pool is created near the coupling section between the memory mounting board 206 and the semiconductor memory adapter board 30 and the semiconductor memory adapter board 30 cannot be efficiently cooled, and since the air is not controlled and outer air is not stably introduced (for example, a turbulence such as Karman vortex tends to be created at the rear end of the memory mounting board 206), it is difficult to efficiently cool the interior of the drive canister 20, especially the HDD 201.

Originally, the drive canister structure has a limit in the amount of air taken in through the horizontal direction, so that according to the present embodiment, a notched section 203 is formed on the upper area of the memory mounting board 206 to widen the air intake opening, so as to efficiently introduce wind flow 2072 of the intake air via the wind direction plate 205 through the notched section 203 to cool the surface of the HDD 201, absorb the heat generated from the HDD 201 by the cooling wind and discharge the heat to the exterior of the drive canister 20. Thereby, abnormal temperature rise within the drive canister 20 can be prevented, and the occurrence of failure can be suppressed. Moreover, by adopting a flap (wind direction plate) structure, the flow speed of the cooling wind on the upper side of the flap (wind direction plate 205) can be increased gradually to perform smooth introduction of intake air. Further, the air on the lower side of the flap (wind direction plate 205) is sucked via negative pressure caused by the fast wind flow immediately before the memory mounting board, so that the cooling wind is caused to also flow above the semiconductor memory adapter board 30. Thus, the air flow is conducted to increase the whole amount of flow of intake air flow.

<Operation>

FIG. 4 is a view illustrating an operation of a wind direction control mechanism. By inserting the semiconductor memory board 207, the wind direction plate 205 is pushed down by a wind direction plate pin 2071 on the semiconductor memory board 207. Therefore, the angle of the wind direction plate 205 can be varied, according to which the intake air pool generated by mounting the semiconductor memory board 207 can be solved. When the semiconductor memory board 207 is removed, downward stress is eliminated, and the returning force of the spring (not shown) of the wind direction plate 205 causes the wind direction plate 205 to return to its original horizontal position. It is also possible to form the wind direction plate pin 2071 via a shape-memory alloy and to deform the same by the stress created during insertion to be tilted rearward with respect to the inserting direction. The shape can be designed to return to its original upright form along with the increase of temperature within the drive canister 20, to thereby enable control of the angle of the wind direction plate 205 by the inner temperature of the drive canister 20. In addition to the above configuration, it is also possible to provide an attribute control mechanism of the wind direction plate on the semiconductor memory board 207.

<Connector Board and Semiconductor Memory Adapter Board>

Figure 5:
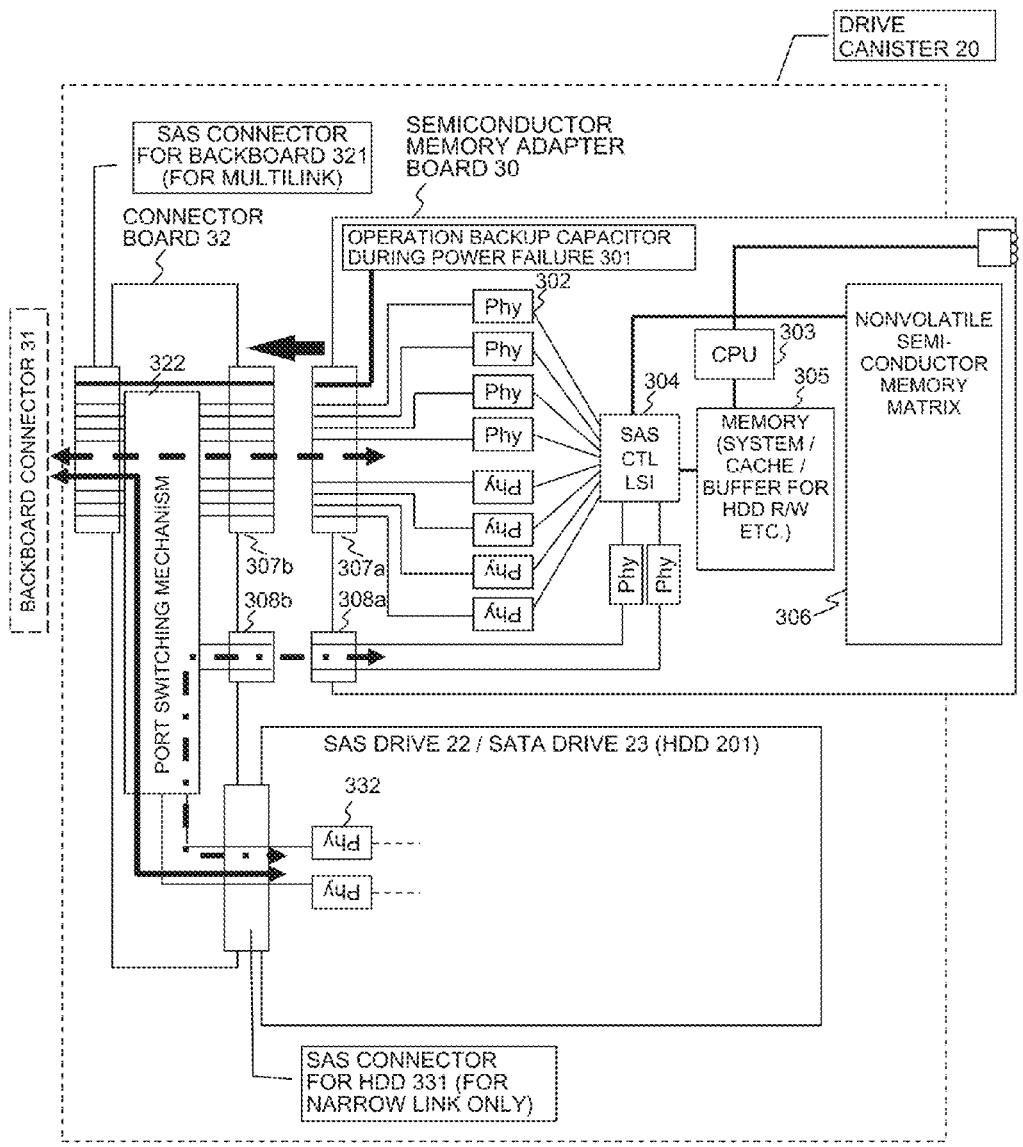
FIG. 5 is a hardware block diagram of a connector board and a semiconductor memory adapter board.

FIG. 5 is a hardware block diagram of a connector board 32 (208 of FIG. 2) and the semiconductor memory adapter board 30. The drive canister 20 is equipped with the semiconductor memory adapter board 30, the HDD 201 (SAS drive 22/SATA drive 23) and the connector board 32, wherein the semiconductor memory adapter board 30 and the HDD 201 are designed to be attachable to or detachable from the drive canister 20.

The semiconductor memory adapter board 30 is equipped with an operation backup capacitor during power failure 301, a Phy (physical port) 302, a CPU 303 controlling the whole semiconductor memory adapter board 30, a SAS control LSI (hereinafter referred to as SAS controller) 304 for coupling via SAS interface with the storage drive or the SAS expander 600, a memory 305 used for storing system data and cache data and for buffering read/write data of the HDD 201 and the like, a nonvolatile memory matrix 306, and a wide link connector 307a and a narrow link connector 308a for coupling to the connector board 32.

The connector board 32 comprises a backboard SAS connector 321 corresponding to multilink for coupling with a backboard connector 31, a port switching mechanism 322, a wide link connector 307b and a narrow link connector 308b for coupling with the semiconductor memory adapter board 30, and an HDD SAS connector 331 for coupling with the HDD 201. The HDD 201 has two narrow link Phys 332 for redundancy.

The connector board 32 is used for coupling the backboard and the respective devices. The connector board 32 has a port switching mechanism 322, and the port to be coupled is switched based on whether the semiconductor memory adapter board 30 is coupled or not. The port switching mechanism 322 can be composed of a PBC (Port Bypass Circuit) or an MUX (Port Multiplexer) and the like. Further, the connection of the semiconductor memory adapter board 30 and the connector board 32 can have a relay board (memory mounting board 206) or a coupling cable (cable 202) intervened, as shown in FIG. 3.

When only the HDD 201 is coupled, the path illustrated by the solid line arrow is coupled via a narrow link. When the semiconductor memory adapter board 30 is coupled, the connector board 32 couples the path shown by the dashed dotted line (MUX operation), and switches the solid line path to the dashed dotted line path based on an instruction from the storage controller 6 of the storage subsystem 1.

This operation enables the SAS expander 600 and the drive canister 20 to be coupled via a wide link, and the connection to the HDD 201 to be performed via a narrow link path passing through the SAS controller 304. Thereby, the attaching and detaching of the semiconductor memory adapter board 30 can be realized even during operation.

FIG. 5 illustrates the physical ports (Phy) independently so as to help understand the relationship thereof with the interface port, but actually, they are mounted inside the SAS controller 304. Further, the connector coupling to the semiconductor memory adapter board 30 is divided into two parts, a wide link connector 307 and a narrow link connector 308, but it can also be an integrated single connector. The connection is not restricted to SAS interfaces, and can be realized via a PCIe (Registered Trademark) interface, for example. Further, an additional function such as an encryption/decryption function or an HDD power saving control function can be provided to the semiconductor memory adapter board 30. Since the drive canister 20 can be removably mounted to the storage subsystem 1 (drive unit 5), so that when the life of the nonvolatile memory matrix 306 ends, it can be easily replaced. It is possible to removably attach the nonvolatile memory matrix 306 to the semiconductor memory adapter board 30. Thereby, it becomes possible to replace only the nonvolatile memory matrix 306 when the lifetime of the nonvolatile memory matrix 206 ends or to increase or decrease the nonvolatile memory capacity. Since the semiconductor memory adapter board can be replaced alone, the number of replacement operation steps can be reduced and the operation time can be shortened.

Next, we will describe the detailed operation of the port switching mechanism 322 of the connector board 32. The port switching mechanism 322 is equipped with a selector having four ports per single system (a total of eight ports for two systems, a redundant system and a current system) for coupling with the SAS expander 600 on the side of the wide link connector 321, and five ports (a total of 10 ports for two systems, a redundant system and a current system) for coupling with the semiconductor memory adapter board 30 and the HDD 201 disposed on the inner side of the port switching mechanism 322. Further, the port switching mechanism 322 includes the HDD 201 and the selector, or the HDD 201 and an MUX for coupling with the semiconductor memory adapter board 30.

If the semiconductor memory adapter board 30 is not mounted or if an LED board described later is mounted, the port switching mechanism 322 controls the selector and the MUX so as to couple the HDD 201 and the SAS expander 600 via a narrow link. In other words, the selector couples the SAS expander 600 and the MUX, and the MUX couples the HDD and the selector. The selector uses only one port out of the four ports in a single system on the SAS expander 600 side, and couples the current system and the redundant system via a narrow link.

When the semiconductor memory adapter board 30 is coupled and mounted to the connector board 32, the port switching mechanism 322 controls the connection of the selector and the MUX as described earlier with reference to FIG. 5. Actually, by inserting the semiconductor memory adapter board 30, the MUX can be coupled to the HDD 201 from the SAS expander 600 side and also from the semiconductor memory adapter board 30 side. Thereafter, based on the instruction from the storage controller 6, the selector switches the path coupled from the SAS expander 600 side directly to the MUX to the path coupling the SAS expander 600 side to the semiconductor memory adapter board 30. At this time, the MUX is coupled to the selector but the input and output from the path is disconnected, so that actually, input and output is performed only through the path on the semiconductor memory adapter board 30 side. The switching of paths of the selector can be set to be performed automatically by inserting an adaptor board, instead of via the storage controller 6. The switching performed by the storage controller 6 is advantageous in that the data transfer timing can be controlled, and that multiple paths can be switched simultaneously. The automatic switching is advantageous in that the circuit configuration can be simplified and costs can be cut down. The switching method is not limited, and methods such as using a communication interface (sub-band) such as an I2C, outputting a command instruction to the SAS, or disposing a dedicated line for switching, can be adopted.

By adopting the configuration mentioned above, access to the HDD 201 is enabled through selector operation even if a certain semiconductor memory adapter board 30 fails to respond due to failure or the like. Deterioration of performance can be suppressed by combining the arrangement with a semiconductor memory adapter board 30 mounted to a drive canister of a spare HDD. The original state can be recovered easily by replacing only the semiconductor memory adapter board 30 where failure has occurred.

<Operation Mode of Semiconductor Memory Adapter Board>

Figure 6:
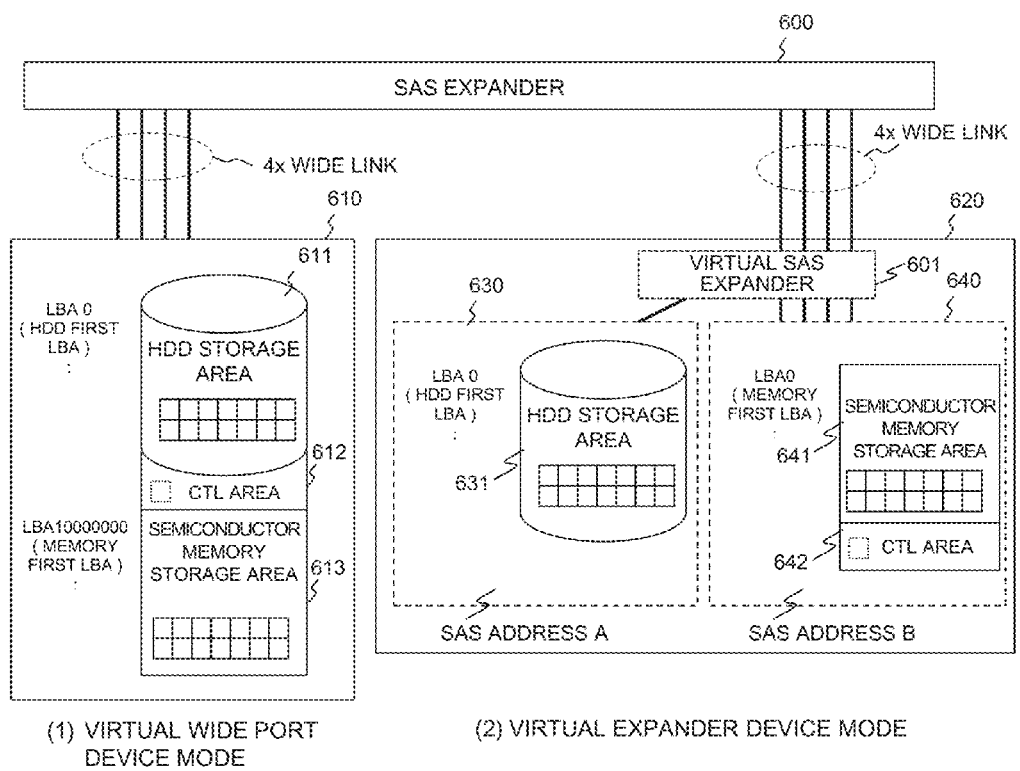
FIG. 6 is a conceptual diagram illustrating an operation mode of the semiconductor memory adapter board.

FIG. 6 is a conceptual diagram illustrating an operation mode of the semiconductor memory adapter board. The semiconductor memory adapter board 30 has two operation modes as illustrated in FIG. 6, and designed to enable different operations according to the purpose of use. In both operation modes, wide link connection is enabled, and maximum transfer performance can be realized. In both operation modes, the address of the data stored in an existing HDD 201 will not be changed, so that it is possible to expand only the semiconductor memory adapter board 30.

(m1) Virtual Wide Port Device Mode

A virtual wide port device mode is a mode where the semiconductor memory adapter board 30 is operated as a single wide port device 610. The access from LBA0 to the last LBA of the HDD 201 will be the access to the HDD 201 (HDD storage area 611), and the access from the address boundary aligned arbitrarily from the last LBA to the maximum LBA of the storage area (semiconductor memory storage area 613) provided by the semiconductor memory adapter board 30 will be the access to the semiconductor memory (nonvolatile memory matrix 306).

When the storage controller 6 accesses the subsequent LBA of the last LBA of HDD, the controller can read information such as the memory capacity and the start/end LBA of the semiconductor memory adapter board 30. Further, the area from the last LBA of the HDD storage area 611 to the first LBA of the semiconductor memory storage area 613 is set as the control area (CTL area 612), which stores control information for controlling the HDD storage area 611 and the semiconductor memory storage area 613.

Further, it is possible to perform settings such as the switching of automatic cache on/off, generation calculation formula of DIF (Data Integrity Field) information when storing the cache data, the calculation formula for obtaining positional information for skipping parity information and so on from the storage controller 6. During automatic cache off, the data that the controller wishes to cache to the semiconductor memory adapter board 30 is copied to the LBA of the semiconductor memory adapter board 30 area, so that the relevant data in the cache memory 300 can be purged from the storage controller 6. In other words, by copying the data that the storage controller 6 wishes to purge from the cache memory 300 to the semiconductor memory storage area 613 of the semiconductor memory adapter board 30 coupled to the HDD 22 (HDD 201) storing the data, the relevant data is discharged from the cache memory 300 but high-speed access is still enabled. In addition, the data having an access frequency higher than the threshold value can be cached to the semiconductor memory adapter board 30 side so as to enable high-speed access to the data.

During automatic cache OFF, the efficiency of use of the semiconductor memory is good, but a resource must be provided on the storage controller 6 side for cache management. During automatic cache ON, the management of the storage controller 6 is not necessary, so that the consumption of resources is suppressed. On the other hand, a mechanism is provided so as not to cache redundant data, so as to prevent redundant data such as parity data from being cached and deteriorating the capacity efficiency of the semiconductor memory adapter board 30. Further, when the redundancy is deteriorated due to HDD failure or the like, a flag is prepared to enable redundant data to be cached (which is instructed to the semiconductor memory adapter board 30 of the remaining drive within the same RAID group). The automatic cache ON is a mode suitable for an external cache function (SSD cache) or a tier storage function of the storage subsystem. During automatic cache ON, the semiconductor memory area 613 is not visible from the storage controller 6.

(m2) Virtual Expander Device Mode

The virtual expander device mode is a mode where the semiconductor memory adapter board 30 responds as a virtual SAS expander 601, and responds to a superior expander (SAS expander 600) as if it has two devices coupled thereto, which are an HDD 630 of a SAS address A (HDD 201: HDD storage area 631) and a 4× wide port virtual SSD 640 of SAS address B (semiconductor memory (nonvolatile memory matrix 306): semiconductor memory storage area 641 and CTL area 642).

For example, in the case of a virtual wide port device mode, there is an image that the storage area of the semiconductor memory is added to the RAID group to which the HDD belongs. However, in the virtual expander device mode, the virtual SSD 640 by the semiconductor memory adapter board 30 can be completely separated from the HDD 630 so that the number of devices in a RAID group and the RAID level by the virtual SSD 640 can be composed in a different manner as the HDD 630. Further, maximum performance of the virtual SSD 640 side can be utilized, so that it is suitable for an SSD-superior operation compared to when the virtual wide port device mode is used. However, the realizing method requires an expander function to be assembled thereto, so that in order to realize the present function, the arrangement becomes more complex compared to when only the virtual wide port device mode is disposed.

Further, as a mode variation other than the virtual wide port device mode and the virtual expander device mode, it is possible to provide a virtual multilink device mode using the wide link by dividing it into multiple individual links.

The virtual multilink device mode is a utilization method for allocating a 2× wide link to the virtual SSD and allocating the remaining two links to two HDDs respectively, for example, when the access performance of the semiconductor memory of the semiconductor memory adapter board 30 is low and the bandwidth of the 4× wide link is not used up. It is also possible to allocate a 3× wide link to the virtual SSD and to allocate the remaining narrow link to a single HDD.

<Starting of Semiconductor Memory Adapter Board>

Figure 7:
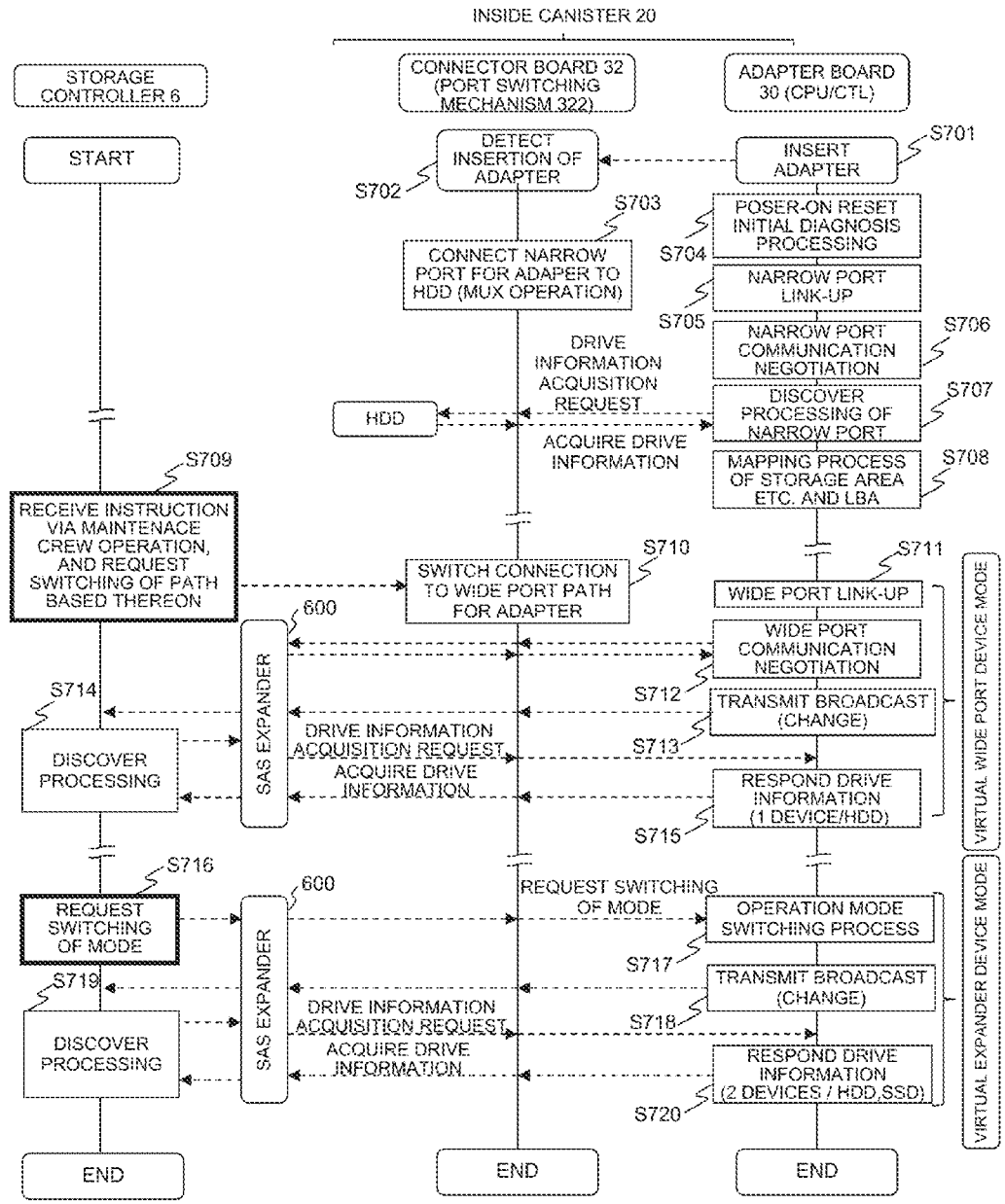
FIG. 7 is a ladder chart illustrating the overall operation from insertion to starting of the semiconductor memory adapter board.

FIG. 7 is a ladder chart illustrating the overall operation from insertion to starting of the semiconductor memory adapter board.

In S701, the semiconductor memory adapter board 30 is inserted to the drive canister 20. In S702, the connector board 32 of the drive canister 20 detects insertion of the semiconductor memory adapter board 30. In S703, the connector board 32 causes the narrow port for the semiconductor memory adapter board 30 to be coupled via an MUX (multiplexer) to the HDD 201.

In S704, power supply is coupled to the semiconductor memory adapter board 30, and the semiconductor memory adapter board 30 performs a power-on-reset initial diagnosis processing and starts the semiconductor memory adapter board 30 itself. In order to establish access with the HDD 201, in S705, the semiconductor memory adapter board 30 performs link-up of the narrow port after completing the starting process. In S706, the semiconductor memory adapter board 30 performs a negotiation processing of the narrow port communication.

In S707, the semiconductor memory adapter board 30 performs a narrow port discover processing. In other words, the semiconductor memory adapter board 30 performs a drive information acquisition request to the storage drive (HDD 201) via the port switching mechanism 322 of the connector board 32. According to a drive information acquisition request, the storage drive (HDD 201) transmits a drive information to the semiconductor memory adapter board 30, and the semiconductor memory adapter board 30 receives the same. In S708, the semiconductor memory adapter board 30 performs mapping of the storage area etc. and the LBA.

In S709, the storage controller 6 of the control unit 2 receives an instruction (change to or setting of the virtual wide port device mode) and the like via manipulation of the maintenance crew, and based thereon, transmits a path switching request to the connector board 32. In S710, the connector board 32 controls the selector to switch the connection to a wide port path for an adapter.

In S711, the semiconductor memory adapter board 30 executes a wide port link-up. In S712, the semiconductor memory adapter board 30 performs a negotiation to execute wide port communication with the SAS expander 600. In S713, the semiconductor memory adapter board 30 transmits a BROADCAST (CHANGE) primitive, and notifies the SAS expander 600 that a change has occurred (change notice) to the interface path to the semiconductor memory adapter board 30. The SAS expander 600 transmits the received change notice to the storage controller 6. Although not illustrated, the respective SAS expanders 600 on the path having received the change notice at this time can execute a discover processing of the device coupled to its own port or of other SAS expanders 600.

In S714, the storage controller 6 having received the change notice executes the discover processing, and acquires a device information coupled to the SAS expander 600. That is, the storage controller 6 issues an SMP_DISCOVER_REQUEST command or an SMP_DISCOVER_LIST command to the SAS expander 600. The SAS expander 600 having received the command transmits a drive information acquisition request to the semiconductor memory adapter board 30. In S715, the semiconductor memory adapter board 30 sends the drive information as the response. The drive information sent as response is information indicating that a single device exists and that device is the HDD 201 (wide port device 610). The SAS expander 600 transmits various information including the acquired drive information to the storage controller 6 as response to the received command.

<Processing During Switching of Mode of Semiconductor Memory Adapter Board>

In S716, the storage controller 6 requests switching of modes to the SAS expander 600. The SAS expander 600 transfers the received mode switching request to the semiconductor memory adapter board 30. In S717, the semiconductor memory adapter board 30 performs an operation mode switching process, that is, performs switching from the virtual wide port device mode to the virtual expander device mode. In S718, the semiconductor memory adapter board 30 transmits a BROADCAST (CHANGE) command, and notifies the SAS expander 600 that a change of interface path has occurred to the semiconductor memory adapter board 30 (change notice).

In S719, the storage controller 6 executes the discover processing and acquires the device information coupled to the SAS expander 600. That is, the storage controller 6 issues an SMP_DISCOVER_REQUEST command or an SMP_DISCOVER_LIST command to the SAS expander 600. The SAS expander 600 having received the command transmits a drive information acquisition request to the semiconductor memory adapter board 30. In S715, the semiconductor memory adapter board 30 responds information showing that it is a SAS expander (virtual SAS expander 601) and the drive information coupled thereto. The drive information sent as response notifies that there are two devices and that the respective devices are an HDD and an SSD. The SAS expander 600 and the virtual SAS expander 601 transmit the acquired (or created) drive information as device information to the storage controller 6. Then, the insertion, starting and mode switching operation of the semiconductor memory adapter board 30 is ended.

In the above processing, when the storage controller 6 issues a SCSI_INQUIRY command to the device during the virtual wide port device mode, the semiconductor memory adapter board 30 changes a portion of the information of the storage drive under the collected control, and sends a response. The changed information includes the identifier such as a flag showing that it is coupled. In another example, it is possible to have the information of the semiconductor memory adapter board 30 returned as response.

In the case of the virtual expander device mode, in response to the request such as the SMP_DISCOVER_LIST command and the like issued to the SAS expander 600, the semiconductor memory adapter board 30 returns a response of the information showing that two end devices are coupled, which are the storage drive (HDD 201) and the virtual SSD (non-volatile semiconductor memory 306 of the semiconductor memory adapter board 30) being controlled. Thereafter, the SCSI command from the storage controller 6 to the storage drive under control is transferred as it is to the storage drive. It is possible to perform pass through, or to respond the information that the semiconductor memory adapter board 30 has collected in advance. Further, the semiconductor memory adapter board 30 responds to the SCSI command of the virtual SSD.

Thereafter, the storage controller 6 issues a SCSI_READ_CAPACITY command and acquires the capacity of the storage drive. In the case of a command of virtual wide port device mode and the virtual expander device mode to the storage drive, the maximum LBA and the like of the drive is reported as response. Regarding the SCSI_READ_CAPACITY command to the virtual SSD of the virtual expander device mode, the maximum LBA and the like corresponding to the storage capacity of the semiconductor memory adapter board 30 is reported.

The storage controller 6 having recognized that the semiconductor memory adapter board 30 is coupled in the virtual wide port device mode issues a read (SCSI_READ) command to the LBA which is greater than the reported maximum LBA (however, the range thereof is predetermined). In response to the access to the LBA, the semiconductor memory adapter board 30 sends out an information block including a status (normal/abnormal), a semiconductor memory storage area first LBA/last LBA (or the number of allocated blocks), a maximum value of the number of rewrites, a maximum proximal threshold of the number of rewrites, the current maximum number of rewrites, and a pointer LBA to a threshold attainment area bitmap.

The detailed operation thereof will be described with reference to a control information access processing illustrated in FIG. 10. In the information listed above, the maximum proximal threshold of the number of rewrites can be set from the storage controller 6. The acquisition of the above-listed information by the virtual expander device mode can be performed via a SCSI_MODE_SENSE command to the virtual SSD and the like.

In the virtual expander device mode, the operation after completing the process of FIG. 7 is a normal I/O operation. In the virtual wide port device mode, if the LU is composed in the range between the first LBA and the last LBA of the above-described semiconductor memory storage area 613, an operation similar to when the relevant area is used as an SSD is performed. The I/O processing of the storage controller 6 at this time is the same as a normal I/O (read, write) operation to a prior art storage drive. The processing including this operation performed by the semiconductor memory adapter board 30 will be described in detail with reference to FIG. 10.

<External Cache Table>

FIG. 8 is a view illustrating a configuration example of an external cache table. An external cache table 80 is a table for managing the semiconductor memory storage area 613 during automatic cache OFF in the virtual wide port device mode, which is created in RAID group units, for example. The external cache table 80 includes a LUN_ID 801, an LBA 802, a cache slot number 803, a valid flag 804, a drive LBA 805, a swap entry 806 and a time stamp 807.

The LUN_ID 801 is information for uniquely identifying the LU. The LBA 802 illustrates the first LBA of the semiconductor memory storage area 613 storing the relevant data. The cache slot number 803 illustrates the capacity of the stored data (number of chunks of a given size or number of blocks). The valid flag 804 is information showing the data status of the data storage area designated by the LBA 802 and the cache slot number 803, and stores one of the following information; valid/invalid/spare ID. The spare ID shows the state where the semiconductor memory adapter board 30 for a spare drive is used, and information for uniquely identifying the semiconductor memory adapter board 30 for the spare drive is stored.

The drive LBA 805 is information showing in which LBA of the storage drive the data stored in the semiconductor memory storage area 613 is stored. The swap entry 806 is information designating the storage destination of the valid data in the entry where the valid flag 804 is "invalid". The time stamp 807 indicates the last access time or the purge time. The external cache table 80 is stored in the shared memory 450 or the memory 430 of the storage controller 6.

<I/O Processing to External Cache Area>

Figure 9:
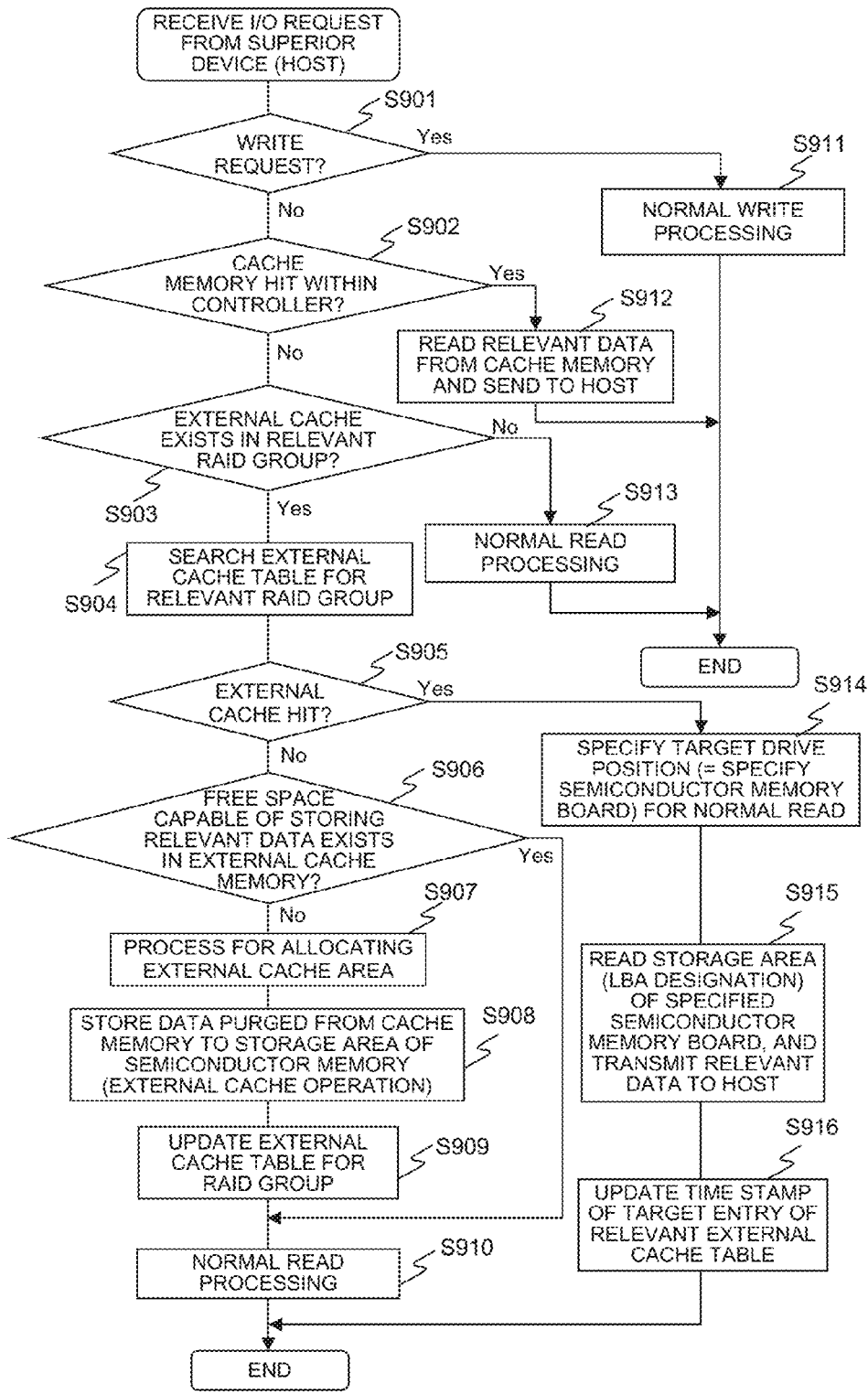
FIG. 9 is a flowchart illustrating an I/O processing from the storage controller to the external cache area of the semiconductor memory adapter board.

FIG. 9 is a flowchart illustrating an I/O processing to an external cache area of the semiconductor memory adapter board 30 by the storage controller 6. The present I/O processing shows the access operation to the semiconductor memory storage area 613 during automatic cache off according to the virtual wide port device mode, wherein the I/O processing during automatic cache ON and during the virtual expander device mode is a normal read/write processing. The present processing is started by receiving an I/O request from the host computer 10 which is a superior device.

In S901, the storage controller 6 determines whether the request is a write request or not. If the request is a write request (Yes), the storage controller 6 executes a normal write processing of S911, and ends the present I/O processing. If the request is not a write request (No), the storage controller 6 determines that the request is a read request, and executes S902. In S902, the storage controller 6 determines whether there is a cache hit of the data cached in the cache memory 300 of the storage controller 6 or not. If there is a hit (Yes), the storage controller 6 reads the data from the cache memory 300, transmits the same to the host computer 10, and ends the present I/O processing (S912).

In S903, the storage controller 6 determines whether there is an external cache memory in the read target RAID group or not. If there is an external cache memory (Yes), the storage controller 6 executes S904. If not (No), the storage controller 6 executes a normal read processing from the storage drive (HDD 201), transmits the read data to the host computer 10, and ends the present I/O processing. In S904, the storage controller 6 searches the external cache table 80 of the read target RAID group, and confirms whether read data exists or not. The search can be executed in RAID group units, so that hit/mishit determination can be performed extremely speedily. Further, since the position information of actual data (drive position determination within RAID group based on LBA 802 and cache slot number 803) can be utilized, it is not necessary to store the position information of the semiconductor memory adapter board 30 to the external cache table 80.

In S905, when the storage controller 6 determines that there is external cache hit, that is, that read data exists (Yes), the storage controller 6 executes S914. When the storage controller 6 determines that there is external cache mishit, that is, that read data does not exist (No), the storage controller 6 executes S906. In S906, the storage controller 6 determines whether free space capable of storing the data exists in the external cache memory (semiconductor memory storage area 613) or not based on the information in the external cache table 80. If there is such free space (Yes), the storage controller 6 executes a normal read processing of S910. Then, the storage controller 6 ends the present I/O processing. If there is no free space (No), the storage controller 6 executes S907.

In S907, the storage controller 6 executes an external cache area allocation processing. An external cache area allocation processing is a processing for allocating a free space having the necessary capacity by sequentially purging the data having the lowest use frequencies in the semiconductor memory storage area 613, if there is not enough free space for storing data purged from the cache memory 300 in the semiconductor memory storage area 613.

In S908, the storage controller 6 stores the data to be purged from the cache memory 300 to the semiconductor memory storage area 613 (external cache operation). By this operation, the data purged from the cache memory 300 is moved to the semiconductor memory storage area 613, and the memory area in the cache memory 300 occupied by that data is freed. In S909, the storage controller 6 creates an entry of the target data to the RAID group external cache table 80, and updates the time stamp 807 by the purge time.

In S914, the storage controller 6 specifies the storage drive position storing the read data, in other words, specifies the semiconductor memory adapter board 30. In S915, the storage controller 6 reads the storage area (LBA-designated) storing the relevant data (subjected to external cache hit) of the specified semiconductor memory adapter board 30, and transmits the data to the host computer 10. In S916, the storage controller 6 updates the time stamp 807 of the target entry of the relevant external cache table 80 by the last access time (read time).

The normal read processing procedure includes the following steps (R1) through (R3).

(R1) The storage controller 6 issues a read command designating an area via the first LBA and the block length to a specific storage drive.

(R2) The storage drive transmits the read data to the storage controller 6 in response to the command.

(R3) The storage controller 6 performs a staging process by storing the received read data in the cache memory 300 and registering the entry of the cache area in a cache table (not shown). If it is not possible to allocate sufficient free space for storing the read data in the cache memory 300, the data is sequentially deleted (purged) from the cache memory 300 in the order starting from the data having the smallest use frequency, and after the free space is allocated, the processing is executed from step (R1) again.

<I/O Processing in Semiconductor Memory Adapter Board>

Figure 10:
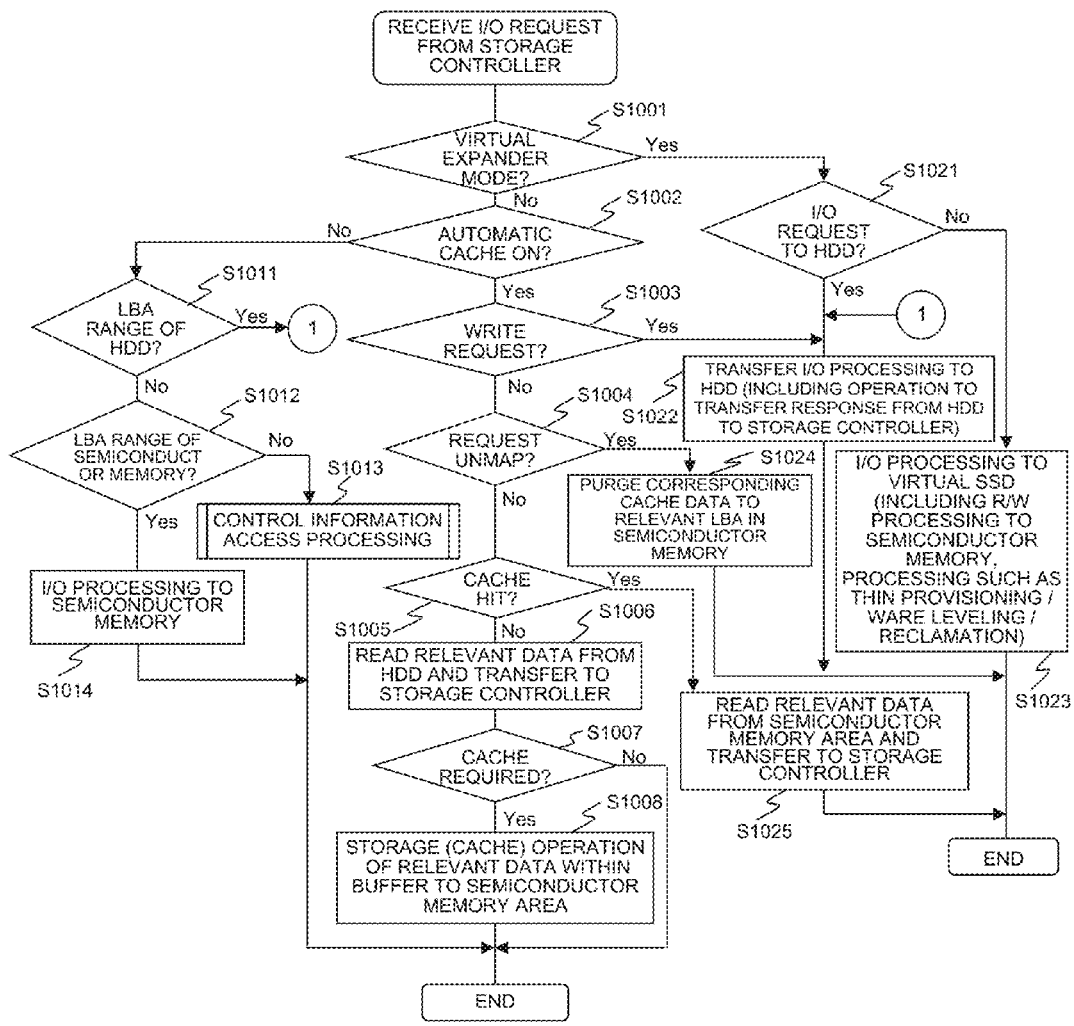
FIG. 10 is a flowchart illustrating an I/O processing in the semiconductor memory adapter board.

FIG. 10 is a flowchart illustrating an I/O processing performed in a semiconductor memory adapter board. The subject of the processing is set as the CPU 303 of the semiconductor memory adapter board 30. The present processing is started when an I/O request from the storage controller 6 is received. Control information such as mode type and automatic cache ON/OFF flag is stored in the memory 305 and the like of the semiconductor memory adapter board 30.

In S1001, the CPU 303 determines whether the mode is a virtual expander device mode or not. If the mode is the virtual expander device mode (Yes), the CPU 303 executes S1021, and if not (No), the CPU 303 executes S1002. In S1002, the CPU 303 determines whether the automatic cache ON is selected. If automatic cache ON is selected (Yes), the CPU 303 executes S1003, and if not (No), the CPU 303 executes S1011. In S1003, the CPU 303 determines whether the request is a write request or not. If the request is a write request (Yes), the CPU 303 executes S1022, and if not (No), the CPU 303 executes S1004. If the write area according to the write request is already cached (the read data from the HDD is already written in the semiconductor memory area), the data of that cache area becomes unnecessary, so that the area is freed or made invalid.

In S1004, the CPU 303 determines whether the request is an area freeing request or not. If the request is an area freeing request (Yes), the CPU 303 executes S1024, and if not (No), the CPU 303 executes S1005. In S1005, the CPU 303 determines whether there is a cache hit. If there is a cache hit (Yes), the CPU 303 executes S1025, and if not (No), the CPU 303 executes S1006. In S1006, the CPU 303 reads the read target data from the HDD 201, and transfers the same to the storage controller 6. At the same time, the read data is stored in the buffer area of the memory 305.

In S1007, the CPU 303 determines whether cache is necessary or not. If cache is necessary (Yes), the CPU 303 executes S1008. If cache is not necessary (No), the CPU 303 ends the present processing. If forced cache flag is OFF and the relevant area is a parity data storage area (area of parity block detection calculation formula 1 or 2 mentioned later), it is determined that cache is unnecessary. A forced cache flag is a flag for caching a normally non-cached parity data forcibly to the semiconductor memory storage area when failure occurs to the storage drive constituting the RAID group and redundancy is lost.

Incidentally, when the number of devices composing a RAID group is represented by n, the own drive position is represented by x (1 to n) and the number of strive unit block number is represented by A, the LBA that satisfies the parity block detection calculation formula 1 (((LBA/A/n) Mod n)+x)=0 is a parity of RAID 5. Further, the LBA that satisfies parity block detection calculation formula 2 (((LBA/A/n) Mod n)+x+1) Mod n) is 1 or smaller (1 or 0) is a parity of RAID 6. Actually, not only the first LBA but also the request target LBA range is checked.

In S1008, the CPU 303 stores the relevant data stored in the buffer area to the semiconductor memory area 613 (cache operation). When the forced cache flag is OFF and parity data is included in a portion of the relevant data, caching is performed while excluding the parity data.

In S1011, the CPU 303 determines whether the request is in an LBA range of the HDD storage area 611 or not. If the request is in the LBA range of the HDD storage area 611 (Yes), the CPU 303 executes S1022, and if not (No), the CPU 303 executes S1012. In S1012, the CPU 303 determines whether the request is in the LBA range of the semiconductor memory storage area 613 or not. If the request is in the LBA range of the semiconductor memory storage area 613 (Yes), the CPU 303 executes S1014, and if not (No), the CPU 303 executes S1013.

In S1013, the CPU 303 executes a control information access processing, that is, a read or write I/O access to the CTL area 612, and ends the present I/O processing. In S1014, the CPU 303 executes an I/O processing to the semiconductor memory area 613. The read/write to the semiconductor memory 306 includes a data storage processing to a designated area that does not accompany the transfer of data to the storage controller 6. According to the data storage processing to this designated area, during replacement of the semiconductor memory adapter board 30, it becomes possible to use the external cache table 80 to recover the replaced semiconductor memory adapter board 30 to the data storage state prior to replacement without changing the external cache table 80 of the storage controller 6.

In S1021, the CPU 303 determines whether the request is an I/O request to the HDD 630 (HDD 201: HDD storage area 631). If the request is an I/O request (Yes), the CPU 303 executes S1023, and if not (No), the CPU 303 executes S1022. In S1022, the CPU 303 transfers the I/O processing to the HDD 630. The present I/O processing includes an operation for transferring the response from the HDD 630 to the storage controller 6.

In S1023, the CPU 303 executes an I/O processing to the virtual SSD 640, and ends the I/O processing in the semiconductor memory adapter board 30. The I/O processing performed to the virtual SSD 640 includes a read/write processing to a semiconductor memory area 641, or processes such as thin provisioning, wear leveling, reclamation and the like. In S1024, the CPU 303 deletes the cache data corresponding to the relevant LBA are of the semiconductor memory area 613, frees the area, and ends the processing. In S1025, the CPU 303 reads the relevant data from the semiconductor memory area 613, transfers the same to the storage controller 6, and ends the processing.

Embodiment 2

A method according to a second embodiment of the present invention will be described with reference to FIG. 11, wherein the semiconductor memory adapter boards 30 are not attached to the drive canister 20, but instead, slots are provided to allow the boards to be attached to the chassis. FIG. 11 is a view illustrating an example of attaching the semiconductor memory adapter boards 30 to the slots on the chassis. FIG. 11(1) illustrates an example where the boards are mounted to the front side of the chassis, wherein the storage drives (HDDs) and the semiconductor memory adapter boards 30 are mounted in a one-to-one relationship. FIG. 11(2) illustrates an example where the boards are mounted within the chassis, wherein the storage drives (HDDs) and the semiconductor memory adapter boards 30 are mounted in a N-to-one relationship. The eight shaded HDDs 1102 constitute a single RAID group (such as 7D+1P).

In the present embodiment, the port switching mechanism 322 is not disposed on the drive canister 20 side, but instead, is disposed within the chassis 1103 (such as on a backboard or a baseboard described later). The processing performed by the storage controller 6 or the CPU 303 is the same as in Embodiment 1. Further, the present embodiment is illustrated as an example preferably adopted to a uniquely designed chassis instead of the standardized SBB chassis.

In FIG. 11(1), the boards are mounted in a one-to-one relationship with the storage drives (HDDs), so that when they are used as external caches, there is no need to store the positional information of the semiconductor memory adapter board 30 to the external cache table 80. It is possible to determine whether an LED display board 33 is mounted or a semiconductor memory adapter board 30 is mounted, for example, by arranging the LED at different positions according to the board type (such as by providing a status LED showing whether the board is normal/abnormal to the semiconductor memory adapter board 30).

As shown in FIG. 11(2), it may be possible to have one semiconductor memory adapter board 30 mounted to correspond to each RAID group unit, though the number of HDDs constituting the RAID group may be restricted thereby. When such connection configuration is adopted, the semiconductor memory adapter board 30 is operated by the virtual expander device mode.

In FIG. 11(2), when the semiconductor memory adapter board 30 is mounted to the slot on a baseboard 1101, the quantity of cooling wind reaching the HDD surfaces (the upper surface and the lower surface having the greatest surface areas) on both sides of the semiconductor memory adapter board 30 is reduced. Therefore, heat cannot be removed sufficiently from the HDDs disposed on both sides of the semiconductor memory adapter board 30. Therefore, the cooling effect of the HDD is improved by providing a wind direction control mechanism on the inner side of a top panel and increasing the amount of wind flowing between the semiconductor memory adapter board 30 and the HDD. In this case, an arrangement is preferably adopted where the wind direction plate is horizontal when the semiconductor memory adapter board 30 is not mounted, and when the board is mounted, the wind direction plate is pushed down by the semiconductor memory adapter board 30. Further, the wind direction plate should adopt a structure where the plate is returned to the horizontal position by a spring when the semiconductor memory adapter board 30 is removed, similar to the example of FIG. 2.

Embodiment 3

A third embodiment of the present invention aims at suppressing deterioration of performance when the semiconductor memory adapter board 30 is replaced due to failure or end of lifetime. According to the prior art, when the SSD fails or the life thereof is ended, all the data or stored data in the SSD must be restored from other SSDs in the same RAID group and copied to the spare SSD, and the replacement is performed in drive units such as HDDs and SSDs, so that the copying time for data recovery is extremely long.

Further, when the flash memory board or the SSD is used as an expanded (external) cache memory, generally the memory was used as a read cache. The reason is because in the case of a write cache operation where update data is cached regardless of access frequency, the end of lifetime of the flash memory is accelerated.

Therefore, if the total capacity of the hot spot of update data exceeds the capacity of the cache memory 300 mounted to the storage controller 6, according to the prior art, the replacement of SSD and the recovery copy processing occur frequently, and the deterioration of performance during that time is inevitable. According to the present system, when the storage controller 6 detects that the lifetime of a specific semiconductor memory adapter board 30 is approximating, the I/O accesses are switched from the semiconductor memory adapter board 30 approximating its lifetime to the semiconductor memory adapter board 30 mounted to the spare disk, and the write processing is performed to the semiconductor memory adapter board 30 of the spare disk. At the same time, destaging of data within the specific semiconductor memory adapter board 30 or the copying of a portion of the data to the spare semiconductor memory adapter board 30 will be performed.

At the initial stage of switching, the read access to data other than the data stored in the spare semiconductor memory adapter board 30 is performed to the semiconductor memory adapter board 30 approximating its lifetime or to the HDD 201 mapped to the semiconductor memory adapter board 30, and a low-load write access performed during destaging process or the like is performed to a specific HDD 201. The read data having an access frequency exceeding the threshold within the specific semiconductor memory adapter board 30 is temporarily moved to the cache memory 300 of the storage controller 6, and the relevant data or the data purged instead can be stored in the spare semiconductor memory adapter board 30. Further, it is possible to not have data stored in the cache memory 300 of the storage controller 6, and to have the data copied among semiconductor memory adapter boards 30 using a SCSI_XCOPY command or the like.

As described, when access to data stored in the semiconductor memory adapter board 30 approaching its lifetime becomes unnecessary, the storage controller 6 notifies the maintenance crew that the relevant semiconductor memory adapter board 30 has become replaceable. As for the destaging process to the HDD 201, it is possible for the semiconductor memory adapter board 30 to perform destaging of the designated data to the HDD 201 based on the instruction from the storage controller 6 of the semiconductor memory adapter board 30, instead of via the storage controller 6.

When the storage controller 6 recognizes that the semiconductor memory adapter board 30 approaching its lifetime has been replaced by the maintenance crew or the like, the processing of a new write request is switched from the spare semiconductor memory adapter board 30 to the replaced semiconductor memory adapter board 30. Thereafter, the data in the spare semiconductor memory adapter board 30 is sequentially destaged to the replaced semiconductor memory adapter board 30 and the mapped HDD 201.

The above operation enables to eliminate the copying process of write data after switching to the spare semiconductor memory adapter board 30, and to move only a portion of the read data cached to the semiconductor memory adapter board 30. Therefore, non-suspension replacement is enabled without losing any of the wide link band provided by the semiconductor memory adapter board 30. According further to the above case, data copy processing to the spare HDD does not occur. According to the present method, non-suspension replacement is made possible, so that the board can be used as an external cache memory area for writing data.

<I/O Processing to Semiconductor Memory>

Figure 12:
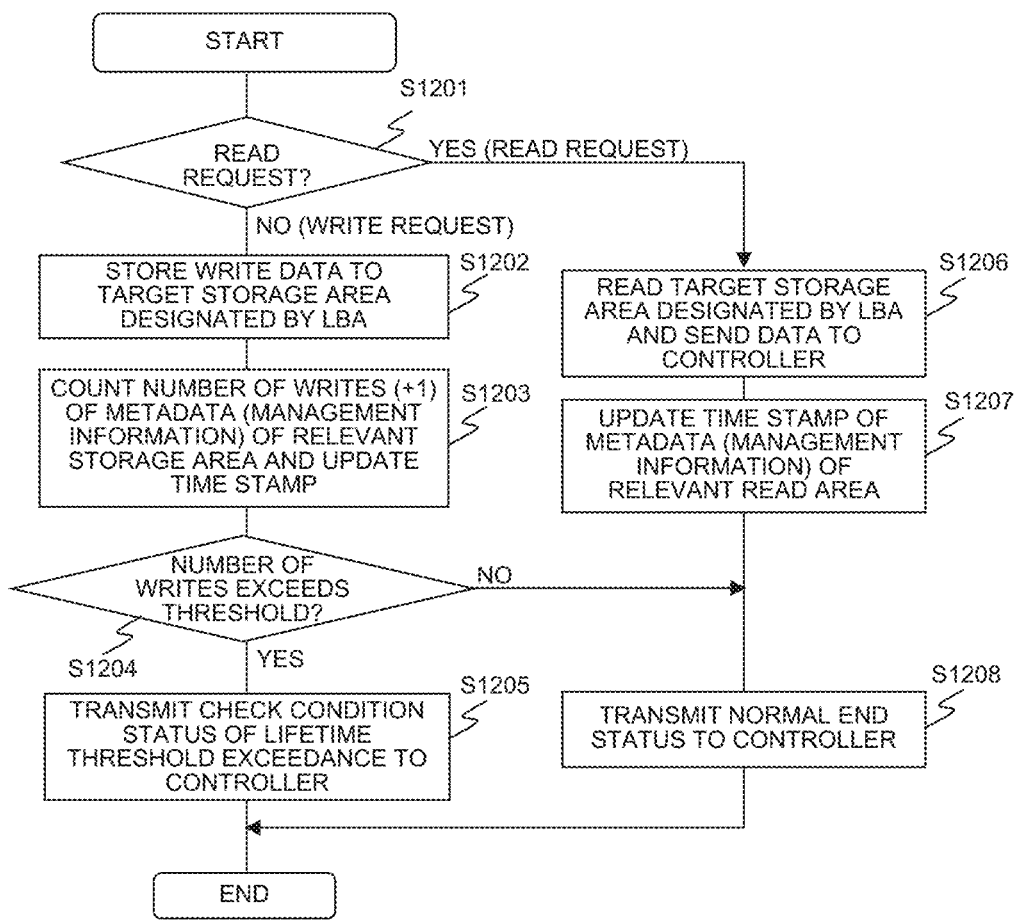
FIG. 12 is a flowchart illustrating an I/O processing of the semiconductor memory adapter board to the semiconductor memory.

FIG. 12 is a flowchart illustrating an I/O processing to the semiconductor memory of the semiconductor memory adapter board. The subject of the processing is the CPU 303 of the semiconductor memory adapter board 30.

In S1201, the CPU 303 determines whether the request is a read request or not. If the request is a read request (Yes), the CPU 303 executes S1206, and if the request is a write request (No), the CPU 303 executes S1202. In S1202, the CPU 303 stores the write data to the designated target storage area by the LBA and the data length in the I/O command. In S1203, the CPU 303 increments the number of writes count of the metadata (management information) of the relevant storage area, and updates the time stamp by the write completion time.

In S1204, the CPU 303 determines whether the number of writes has exceeded a number of writes threshold (lifetime threshold) set in advance. If the threshold is exceeded (Yes), the CPU 303 executes S1205, and if not exceeded (No), the CPU 303 executes S1208. In S1205, the CPU 303 transmits a check condition status of lifetime threshold exceedance to the storage controller 6.

In S1206, the CPU 303 reads the target storage area computed by the LBA and the data length of the I/O command, and transmits the read data to the storage controller 6. In S1207, the CPU 303 updates the time stamp of the metadata (management information) of the relevant read area by the read time. In S1208, the CPU 303 transmits a normal completion status to the storage controller 6.

In the I/O processing to the semiconductor memory, the storage controller 6 having received the check condition status (S1205) of lifetime threshold exceedance performs processing according to the following steps (RP1) through (RP10).

(RP1) The storage controller 6 maps the spare semiconductor memory adapter board 30 to the semiconductor memory adapter board 30 having reached its lifetime, and transfers the subsequent write requests to the semiconductor memory adapter board 30 having reached its lifetime to the spare semiconductor memory adapter board 30.

(RP2) The storage controller 6 refers to the external cache table 80, and starts destaging the write-cached data from the semiconductor memory adapter board 30 having reached its lifetime to the storage drive (HDD 201).

(RP3) The storage controller 6 refers to the external cache table 80, and stages the data having an access frequency exceeding the threshold value out of the data that had been read-cached to the semiconductor memory adapter board 30 having reached its lifetime to the cache memory 300 of the storage controller 6 or copies the data to the spare semiconductor memory adapter board 30, and updates the external cache table 80.

(RP4) When the processes of (RP2) and (RP3) have been completed, the storage controller 6 switches the port switching mechanism 322 coupled to the semiconductor memory adapter board 30 having reached its lifetime to the storage drive side, and transmits a notice to the maintenance crew that the relevant semiconductor memory adapter board 30 having reached its lifetime is replaceable.

(RP5) The maintenance crew removes the semiconductor memory adapter board 30 having reached its lifetime from the memory mounting board 206 in the drive canister 20 or the baseboard 1101/backboard, and attaches a new replacement semiconductor memory adapter board 30.

(RP6) After replacement, when the maintenance crew executes step S709 of FIG. 7, the storage controller 6 performs a discover processing according to the step (S714 or S719) of FIG. 7 to have the replaced semiconductor memory adapter board 30 recognized by the storage controller 6.

(RP7) The storage controller 6 transfers (recovers) the write request to the spare semiconductor memory adapter board 30 after the process of (RP6) has been completed to the replaced semiconductor memory adapter board 30.

(RP8) The storage controller 6 refers to the external cache table 80, and starts destaging the data write-cached to the spare semiconductor memory adapter board 30 to the relevant storage drive.

(RP9) The storage controller 6 refers to the external cache table 80 and either stages the data having an access frequency exceeding the threshold value out of the read-cached data in the spare semiconductor memory adapter board 30 to the cache memory 300 of the storage controller 6 or copies the data to the replaced semiconductor memory adapter board 30, and updates the external cache table 80.

(RP10) When the processes of (RP8) and (RP9) have been completed, the storage controller 6 cancels the mapping between the spare semiconductor memory adapter board 30 and the replaced semiconductor memory adapter board 30, and ends the present series of processes. Thereafter, by the storage controller 6 checking the number of writes and the like of the used spare semiconductor memory adapter board 30, the maintenance crew can output an instruction to the new semiconductor memory adapter board 30 to perform preventive replacement or the like.

As described, the present invention enables multiple small-capacity semiconductor memory adapters to be attached in a removable manner, and adopts a wide port for the SAS interface and uses the semiconductor memory in an HDD read cache area, to thereby enable the backend-side I/O processing performance to be improved and enable a single semiconductor memory adapter to be replaced at a time. The present invention enables to suppress the increase of costs and enhance the transfer bandwidth, and to facilitate the response to failure when the semiconductor memory reaches its lifetime. The present invention further realizes efficient cooling by adopting a wind direction control structure.

The present invention is not restricted to the above-illustrated preferred embodiments, and can include various modifications. The above-illustrated embodiments are described in detail to help understand the present invention, and the present invention is not restricted to a structure including all the components illustrated above. Further, a portion of the configuration of an embodiment can be replaced with the configuration of another embodiment, or the configuration of a certain embodiment can be added to the configuration of another embodiment. Moreover, a portion of the configuration of each embodiment can be added to, deleted from or replaced with other configurations.

A portion or whole of the above-illustrated configurations, functions, processing units, processing means and so on can be realized via hardware configuration such as by designing an integrated circuit. Further, the configurations and functions illustrated above can be realized via software by the processor interpreting and executing programs realizing the respective functions. The information such as the programs, tables and files for realizing the respective functions can be stored in a storage device such as a memory, a hard disk or an SSD, or in a memory media such as an IC card, an SD card or a DVD. Only the control lines and information lines considered necessary for description are illustrated in the drawings, and not necessarily all the control lines and information lines required for production are illustrated. In actual application, it can be considered that almost all the components are mutually coupled.

REFERENCE SIGNS LIST

1: Storage subsystem, 2: Basic chassis, 3: Expanded chassis, 4: Controller unit, 5: Drive unit, 6: Storage controller, 20: Drive canister, 21, 22: SAS drive, 23: SATA drive, 30: Semiconductor memory adapter board, 31: Backboard connector, 32: Connector board, 80: External cache table, 201: HDD, 202: Cable, 203: Notched section, 204: Handle, 205: Wind direction plate, 206: Memory mounting board, 207: Semiconductor memory board, 208: Connector board, 303: CPU, 322: Port switching mechanism, 611, 631: HDD storage area, 612, 642: CTL area, 613, 641: Semiconductor memory storage area, 2071: Wind direction plate pin, 2072: Wind flow.

The invention claimed is:

1. A drive canister coupled to a storage subsystem, the drive canister comprising:
 a connector board for coupling with a storage controller controlling the storage subsystem;
 a detachable storage drive coupled to the connector board and a detachable semiconductor memory adapter board; and
 a wind direction plate for controlling a direction of cooling wind toward the storage drive and the semiconductor memory adapter board; wherein
 the wind direction plate changes an inclination of the wind direction plate according to a mounting status of the semiconductor memory adapter board so as to change the direction of cooling wind to the storage drive and the semiconductor memory adapter board;
 the storage drive and the storage controller are coupled via a single signal line of a plurality of signal lines;
 the semiconductor memory adapter board is coupled to the connector board via multiple signal lines of the plurality of signal lines including two or more lines having redundancy;
 the semiconductor memory adapter board has a semiconductor memory, and data read from the storage drive is stored in the semiconductor memory as a read cache area.

2. The drive canister of a storage subsystem according to claim 1, wherein
 the connector board includes a port switching mechanism for controlling the connection between the storage controller, the storage drive and the semiconductor memory adapter board, wherein
 the port switching mechanism is caused to
 directly couple the storage controller and the storage drive when the semiconductor memory adapter board is not coupled to the connector board; and
 couple the storage controller and the storage drive via the semiconductor memory adapter board when the semiconductor memory adapter board is coupled to the connector board.

3. The drive canister of a storage subsystem according to claim 1, wherein
 an access mode from the storage controller to the storage drive and the semiconductor memory adapter board includes one or more of the following modes:
 a virtual wide port device mode in which the semiconductor memory adapter board operates as a single wide port device;
 a virtual expander device mode in which the semiconductor memory adapter board is coupled to the storage drive and the semiconductor memory via the multiple signal lines and operated thereby; and
 a virtual multilink device mode in which two or more signal lines out of the multiple signal lines couple the storage drive and the remaining signal lines couple the semiconductor memory adapter board for operation.

4. The drive canister of the storage subsystem according to claim 3, wherein
 the virtual expander device mode has an automatic cache mode for further controlling whether the data read from the storage drive should be automatically stored in the semiconductor memory or not.

5. The drive canister of the storage subsystem according to claim 1, wherein
 the semiconductor memory adapter board is equipped with a wind direction plate pin, and controls the inclination of the wind direction plate by the wind direction plate pin.

6. A storage subsystem, comprising:
 a storage controller for controlling the storage subsystem;
 one or more detachable storage drives including a storage drive and one or more detachable semiconductor memory adapter boards including a semiconductor memory adapter board;
 a baseboard coupling to the storage drive and the semiconductor memory adapter board;
 a chassis for storing the one or more detachable storage drives, the one or more detachable semiconductor memory adapter boards and the baseboard; and
 a wind direction plate positioned in relation to the storage drive for controlling a direction of cooling wind toward the storage drive and the semiconductor memory adapter board; wherein
 the wind direction plate changes an inclination of the wind direction plate according to a mounting status of the semiconductor memory adapter board so as to change the direction of cooling wind to the storage drive and the semiconductor memory adapter board;
 the storage drive and the storage controller are coupled via a single signal line of a plurality of signal lines;
 the semiconductor memory adapter board is coupled to the baseboard via multiple signal lines of the plurality of signal lines including two or more lines having redundancy;
 the semiconductor memory adapter board has a semiconductor memory, and data read from the storage drive is stored in the semiconductor memory as a read cache area.

7. The storage subsystem according to claim 6, wherein
 the baseboard includes a port switching mechanism for controlling the connection between the storage controller, the storage drive and the semiconductor memory adapter board, wherein
 the port switching mechanism is caused to
 directly couple the storage controller and the storage drive when the semiconductor memory adapter board is not coupled to the baseboard; and
 couple the storage controller and the storage drive via the semiconductor memory adapter board when the semiconductor memory adapter board is coupled to the baseboard.

8. The storage subsystem according to claim 6, wherein
 an access mode from the storage controller to the storage drive and the semiconductor memory adapter board includes one or more of the following modes:
 a virtual wide port device mode in which the semiconductor memory adapter board operates as a single wide port device;
 a virtual expander device mode in which the semiconductor memory adapter board is coupled to the storage drive and the semiconductor memory via the multiple signal lines and operated thereby; and
 a virtual multilink device mode in which two or more signal lines out of the multiple signal lines couple multiple storage drives of the one or more detachable storage drives and the remaining signal lines couple the semiconductor memory adapter board for operation.

9. The storage subsystem according to claim 8, wherein the virtual expander device mode has an automatic cache mode for further controlling whether the data read from the storage drive should be automatically stored in the semiconductor memory or not.

10. The storage subsystem according to claim 6, wherein the semiconductor memory adapter board is equipped with a wind direction plate pin, and controls the inclination of the wind direction plate by the wind direction plate pin.

11. A method for controlling a storage subsystem, the storage subsystem comprising:
a storage controller for controlling the storage subsystem;
one or more detachable storage drives including a storage drive and one or more detachable semiconductor memory adapter boards including a semiconductor memory adapter board;
a baseboard coupling to the storage drive and the semiconductor memory adapter board;
a chassis for storing the one or more detachable storage drives, the one or more detachable semiconductor memory adapter boards and the baseboard; and
a wind direction plate positioned in relation to the storage drive for controlling a direction of cooling wind toward the storage drive and the semiconductor memory adapter board; wherein
the wind direction plate changes an inclination of the wind direction plate according to a mounting status of the semiconductor memory adapter board so as to change the direction of cooling wind to the storage drive and the semiconductor memory adapter board;
the storage drive and the storage controller are coupled via a single signal line of a plurality of signal lines;
the semiconductor memory adapter board is coupled to the baseboard via multiple signal lines of the plurality of signal lines including two or more lines having redundancy;
the semiconductor memory adapter board has a semiconductor memory, and data read from the storage drive is stored in the semiconductor memory as a read cache area.

12. The method for controlling a storage subsystem according to claim 11, wherein
the baseboard includes a port switching mechanism for controlling the connection between the storage controller, the storage drive and the semiconductor memory adapter board, wherein
the port switching mechanism is caused to
directly couple the storage controller and the storage drive when the semiconductor memory adapter board is not coupled to the baseboard; and
couple the storage controller and the storage drive via the semiconductor memory adapter board when the semiconductor memory adapter board is coupled to the baseboard.

13. The method for controlling a storage subsystem according to claim 11, wherein
an access mode from the storage controller to the storage drive and the semiconductor memory adapter board includes one or more of the following modes:
a virtual wide port device mode in which the semiconductor memory adapter board operates as a single wide port device;
a virtual expander device mode in which the semiconductor memory adapter board is coupled to the storage drive and the semiconductor memory via the multiple signal lines and operated thereby; and
a virtual multilink device mode in which two or more signal lines out of the multiple signal lines couple multiple storage drives of the one or more detachable storage drives and the remaining signal lines couple the semiconductor memory adapter board for operation.

14. The method for controlling a storage subsystem according to claim 13, wherein
the virtual expander device mode has an automatic cache mode for further controlling whether the data read from the storage drive should be automatically stored in the semiconductor memory or not.

15. The method for controlling a storage subsystem according to claim 11, wherein the semiconductor memory adapter board is equipped with a wind direction plate pin, and controls the inclination of the wind direction plate by the wind direction plate pin.

* * * * *